(12) United States Patent
Tsuchiya

(10) Patent No.: US 7,135,815 B2
(45) Date of Patent: Nov. 14, 2006

(54) ORGANIC ELECTROLUMINESCENT DEVICE, METHOD FOR MANUFACTURING THE SAME, AND DISPLAY UNIT

(75) Inventor: Yutaka Tsuchiya, Hara-mura (JP)

(73) Assignee: Seiko Epson Corporation, Tokyo (JP)

( * ) Notice: Subject to any disclaimer, the term of this patent is extended or adjusted under 35 U.S.C. 154(b) by 86 days.

(21) Appl. No.: 10/384,648

(22) Filed: Mar. 11, 2003

(65) Prior Publication Data

US 2003/0209707 A1    Nov. 13, 2003

(30) Foreign Application Priority Data

Mar. 18, 2002    (JP)    ............................. 2002-074675

(51) Int. Cl.
 H01J 1/62    (2006.01)
 H01J 63/04    (2006.01)
 B32B 9/00    (2006.01)
(52) U.S. Cl. ...................... 313/502; 313/503; 313/504; 313/506; 428/690
(58) Field of Classification Search ................ 313/502, 313/503, 504, 506; 428/690, 917
 See application file for complete search history.

(56) References Cited

U.S. PATENT DOCUMENTS

| | | | |
|---|---|---|---|
| 5,796,509 A | 8/1998 | Doany et al. | |
| 5,965,280 A * | 10/1999 | Roitman et al. | 428/690 |
| 6,087,772 A * | 7/2000 | Ootsuki et al. | 313/505 |
| 6,462,470 B1 * | 10/2002 | Ootsuki et al. | 313/504 |
| 6,510,195 B1 * | 1/2003 | Chappo et al. | 378/19 |
| 6,635,989 B1 * | 10/2003 | Nilsson et al. | 313/512 |
| 6,703,146 B1 * | 3/2004 | Sakaguchi et al. | 428/690 |
| 2003/0203235 A1 * | 10/2003 | Ishii et al. | 428/690 |
| 2003/0224202 A1 * | 12/2003 | Brown et al. | 428/690 |
| 2003/0224203 A1 * | 12/2003 | Raychaudhuri et al. | 428/690 |

* cited by examiner

Primary Examiner—Long Pham
Assistant Examiner—Shrinivas H. Rao
(74) Attorney, Agent, or Firm—Oliff & Berridge, PLC

(57) ABSTRACT

The invention provides an organic EL device that includes light-transmitting portions having a high transmittance factor and is suitable to light display units, a method for readily manufacturing such an organic EL device with a high yield, and a display unit including the organic EL device. An organic electroluminescent device includes a support substrate and an element region, disposed on the support substrate, including emissive portions and openings. The emissive portions each include an anode, an emissive layer containing an organic electroluminescent material, and a cathode that are arranged in that order and emit light rays to an irradiated body. The openings extend through the element region, and the emitted rays are reflected by the irradiated body to pass through the openings to form an image.

10 Claims, 5 Drawing Sheets

ORGANIC ELECTROLUMINESCENT DEVICE, METHOD FOR MANUFACTURING THE SAME, AND DISPLAY UNIT

BACKGROUND OF THE INVENTION

1. Field of Invention

The present invention relates to organic electroluminescent (EL) devices, methods for manufacturing such devices, and display units. The present invention particularly relates to an organic EL device that is placed at the front area of an irradiated body and that is suitable to display an image using light rays reflected by the irradiated body, a method for manufacturing such an organic EL device, and a display unit including the organic EL device.

2. Description of Related Art

The related art includes non-emissive displays, such as reflective liquid crystal panels, having an organic EL device functioning as a front light (lighting device). Such an organic EL device can be used not only as a lighting device, but also as an emissive display. The organic EL device has a basic configuration in which a transparent electrode (anode), an emissive layer, and a metal electrode (cathode) are disposed on, for example, a glass substrate, in that order. The anode includes a material having a large function, the cathode includes a material having a small function, and the emissive layer includes an organic EL material. Holes and electrons supplied from the anode and the cathode, respectively, to the emissive layer are coupled in the emissive layer, thereby emitting light.

SUMMARY OF THE INVENTION

When an organic EL device is used for display, the organic EL device must have a configuration in which a metal electrode functioning as a cathode, an emissive layer, and a transparent electrode functioning as an anode are disposed on a substrate in that order, such that the emissive layer can be viewed. In this case, the cathode is disposed over the substrate, and it is not necessary to pattern the cathode. In contrast, when the organic EL device is used for, for example, front lights for display, the cathode including metal must not be disposed over the substrate in order to display an image. Therefore, it is necessary to pattern the cathode.

When the organic EL layer, used for a front light, having the above configuration is manufactured, the following procedure is required: a transparent conductive film is formed over a substrate; an emissive layer is formed on the transparent conductive film; a double-layer film, including an alkaline earth metal layer including Ca or the like and a metal layer including Al or the like, functioning as a cathode is formed on the emissive layer; and the double-layer film is processed by a dry-etching process. In order to form emissive portions of the organic EL device, different etchants must be used to etch a plurality of layers including different materials. That is, different etchants must be used depending on the resistance of each layer to the etchants, thereby causing the manufacturing apparatus and the manufacturing process to be complicated due to an increase in the kind of etchants.

In the above organic EL device, it is necessary to increase the efficiency of injecting electrons into the emissive layer from the cathode, maintain the stability of the cathode, and obtain a large reflection factor. In order to achieve the above advantages, the cathode includes a multilayer film consisting of an alkaline earth metal layer including Ca (calcium), Mg (magnesium), or the like, which has a small work function, and a metal layer including Al (aluminum), Ag (silver), or the like, which has a large work function, in many cases. Since an alkaline earth metal, such as Ca, contained in the cathode has high activity, it is difficult to pattern the alkaline earth metal layer. Therefore, there is a problem in that the manufacturing of the organic EL device with high yield is difficult.

In order to eliminate the above patterning step to simplify the manufacturing process, the cathode is formed over the display surface using a transparent material. However, when the organic EL device having such a configuration is used for the front light, there is a problem in that the transmittance factor is small.

The present invention addresses or solves the above problems, and provides an organic EL device that includes emissive portions having a large transmittance factor and is therefore suitable to light display units.

The present invention can also provide a method for manufacturing an organic EL layer suitable to light display units. The method includes a simple manufacturing process and provides high yield.

The present invention can also provide a display unit that includes an organic EL device according to the present invention, can display a bright image, and has excellent visibility.

(Organic EL Device)

In order to address or solve the above and/or other problems, an organic EL device according to the present invention includes a support substrate and an element region, disposed on the support substrate, including emissive portions and openings. The emissive portions each include an anode, an emissive layer containing an organic electroluminescent material, and a cathode that are arranged in that order and emit light rays to an irradiated body. The openings extend through the element region. The emitted rays are reflected by the irradiated body to pass through the openings to form an image.

In the organic EL device according to the present invention having the above configuration, the openings extend through the element region disposed on the support substrate. In the element region, regions except for the openings correspond to the emissive portions. Since the element region has such a configuration, the organic EL device has a large transmittance factor when light rays reflected by the irradiated body pass through the openings to form an image. Thus, when this organic EL device is used as a lighting device disposed at the front area of a display unit, light for display is not attenuated by the organic EL device, thereby obtaining a bright and sharp image.

In the organic EL device according to the present invention, the openings are preferably formed by patterning the element region.

In the organic EL device having the above configuration, since the emissive portions are formed by pattering an entire face of the element region in one step, alternative emissive portions having various patterns can be formed in this manner. Furthermore, the malfunction of the emissive portions occurs less frequently as compared with related art emissive portions formed by patterning specific regions part by part depending on desired patterns. Thus, this organic EL device has high reliability.

The organic EL device according to the present invention may further include a display region. The openings preferably have an area that is 80% or more of that of the display region.

According to the above configuration, the organic EL device has high luminance and a large aperture ratio, and the emissive portions are not recognizable for users. Thereby, excellent visibility can be achieved when the organic EL device is placed at the front area of a display unit. The display region of this organic EL device is herein defined as an area in a face of the support substrate. The face corresponds to the display region of the display unit having the organic EL device at the front area thereof. The luminance of the organic EL device functioning as a lighting device is decreased as the area of the openings is increased. Thus, the upper limit of the area of the openings is about 90% of that of the display region of the organic EL device in practical use. This upper limit depends on the luminance of the emissive portions.

In the organic EL device according to the present invention, the emissive portions are preferably arranged in substantially a striped or grid pattern when viewed from above.

According to the organic EL device having the above configuration, light rays can be uniformly applied onto an irradiated body and the emissive portions (regions except for the openings) are hardly recognizable when rays reflected by the irradiated body pass through the organic EL device to form an image. When the emissive portions are arranged in a grid pattern, the area to emit light is increased and therefore the luminance and the uniformity are enhanced, although the pattern of the emissive portions is complicated.

In the organic EL device according to the present invention, the support substrate may include a pair of mounting terminals on a surface where the element region is disposed, one of the mounting terminals may be connected to the anode of each emissive portion, and the other may be connected to the cathode with a connecting electrode extending along a side of the emissive portion.

According to the organic EL device having the above configuration, the mounting terminals connected to the anode and the cathode are disposed on the support substrate. Therefore, for example, when a protective substrate or layer to protect the emissive portions is formed on the reverse of the support substrate face having the mounting terminals thereon, it is not necessary to form additional mounting terminals on the protective substrate or layer. Therefore, a structure disposed above the element region can be simplified, thereby readily manufacturing the organic EL device. Furthermore, the mounting terminals can be readily connected to external driving circuits.

The organic EL device according to the present invention may further include a protective substrate disposed at a position opposite to the support substrate having the element region thereon. The support substrate has a mounting terminal on a surface facing the protective substrate, the protective substrate has another mounting terminal on a surface facing the support substrate, the mounting terminal of the support substrate is connected to the anode of each emissive portion, and the mounting terminal of the protective substrate is connected to the cathode of the emissive portion.

According to the organic EL device having the above configuration, the element region is disposed between the support substrate and the protective substrate, the anode disposed at a position near the support substrate is connected to the mounting terminal on the support substrate, and the cathode disposed at a position near the protective substrate is connected to the mounting terminal on the protective substrate. Therefore, the anode and the cathode can be readily electrically connected to the mounting terminals.

The organic EL device according to the present invention may further include a protective substrate disposed at a position opposite to the support substrate having the element region thereon. The support substrate has a pair of mounting terminals on a surface facing the protective substrate, one of the mounting terminals is connected to the cathode, and the other is connected to the anode with a connecting electrode extending along a side of each emissive portion.

According to the organic EL device having the above configuration, the element region has no mounting terminals on its face opposite to the support substrate. Therefore, the element region can be readily formed on the support substrate and the openings can be readily formed by patterning the element region.

In the organic EL device according to the present invention, the emissive portions may each have a light-shielding layer, disposed on the cathode, having conductivity, and the cathode is preferably connected to the mounting terminal of the support substrate or the protective substrate with the light-shielding layer.

According to the above configuration, the light-shielding layer connects the mounting terminal to the cathode, and shields the emissive portions. Therefore, the structure can be simplified, thereby reducing the manufacturing cost and enhancing the productivity.

In the organic EL device according to the present invention, the openings may have a transparent resin material therein.

According to the above configuration, the side face of each emissive portion in contact with the openings can be protected by the resin material disposed in the openings, thereby providing high reliability to the organic EL device. When the cathode of each emissive portion has an alkaline earth metal layer, Ca and the like contained in the alkaline earth metal layer react with oxygen and moisture in the atmosphere. Therefore, there is a problem in that the life of the organic EL device is decreased. However, in the above configuration, since the openings are filled with the resin material, the alkaline earth metal layer protected by the resin material can be prevented from deteriorating or the deterioration is reduced.

(Method for Manufacturing Organic EL Device)

In the present invention, an organic EL device includes a support substrate, and an element region, disposed on the support substrate, including emissive portions and openings, the emissive portions each including an anode, an emissive layer containing an organic electroluminescent material, and a cathode that are arranged in that order. A method for manufacturing the organic EL device includes: forming the element region on the support substrate, and etching the element region to form openings that extend through the element region and have a predetermined shape.

According to the above method for manufacturing an organic EL device of the present, the openings are arranged so as to form a predetermined pattern in one step after the element region is formed. Therefore, only one etchant may be used in the opening-forming step and the man-hours are not increased, that is, the manufacturing process can be simplified and the productivity can be enhanced, thereby increasing the yield. Thus, the organic EL device including the openings having a large transmittance factor can be manufactured with high yield.

In particular, in order to form the emissive portions arranged in a predetermined pattern by a related art method, a plurality of etchants for etching corresponding layers must be used, and therefore it is necessary to take measures to prevent an etchant from causing damage to other layers except for the corresponding layer. However, in this manufacturing method of the present invention, a technique for selectively etching an individual layer is not used, and instead the following technique is used: all layers included in the element region are etched in one step using such a single etchant that can etch all the layers. Therefore, the organic EL device can be readily manufactured. In the manufacturing method of the present invention, the openings are formed so as to extend through the element region and therefore the etching process may not be controlled with high accuracy, thereby readily manufacturing the organic EL device. That is, the etching may be terminated at the point of time the support substrate is exposed at the bottoms of the openings and problems do not arise even if the support substrate is slightly etched. Therefore, the control of the etching is not difficult. In the step of forming the element region before the formation of the openings, layers to form the element region may be provided over the support substrate in a stacked manner, thereby simplifying the manufacturing process.

In the present invention, an organic EL device includes a support substrate, and an element region, disposed on the support substrate, including emissive portions and openings, the emissive portions each including an anode, an emissive layer containing an organic electroluminescent material, and a cathode that are arranged in that order. A method for manufacturing the organic EL device includes: providing an anode, an emissive layer, and a cathode on a support substrate in that order to form the element region; forming a photoresist on the element region; patterning the photoresist disposed on the element region to form a predetermined pattern; and etching the element region according to the pattern of the photoresist to form openings.

According to the above manufacturing method including the above steps, the photoresist disposed on the element region (emissive portions) is exposed and then developed to form a predetermined pattern, and the resulting element region is etched in one step according to the photoresist pattern, thereby forming the emissive portions with high accuracy.

In this manufacturing method, the thickness of the photoresist is not limited to a specific value. However, if the photoresist is perfectly removed before the openings are completed during the etching step, part of the element region, which must not be etched, is etched, thereby causing problems. Thus, the photoresist must have such a sufficient thickness that the photoresist is not perfectly removed before the completion of the openings during the etching step. However, when the photoresist has an excessively large thickness, there is a risk that the following problems arise: the organic EL device has a large thickness and the openings cannot be formed with high accuracy.

In the method for manufacturing an organic EL device according to the present invention, the photoresist may include a photosensitive resin material having conductivity and light-shielding properties.

According to this manufacturing method, the photoresist disposed on the element region can be used as a connecting electrode to connect each cathode to a corresponding mounting terminal, thereby manufacturing the organic EL device with high efficiency. In this manufacturing method, the photoresist is formed on the element region in a predetermined pattern and the element region is etched according to the photoresist pattern in one step to form the openings. After the completion of the openings, part of the photoresist remains on the resulting element region including the emissive portions. When each photoresist layer disposed on a corresponding emissive portion has conductivity, the photoresist layer can be used as a connecting electrode to connect each cathode to a corresponding mounting terminal. Furthermore, when the photoresist layer on the emissive portion has light-shielding properties, this photoresist layer can be used instead of a light-shielding layer usually formed on the cathodes or parts of the cathodes located at a position opposite to the support substrate. Thus, the configuration of the organic EL device can be simplified, and therefore the organic EL device can be readily manufactured.

The method for manufacturing an organic EL device according to the present invention may further include: forming mounting terminals on the support substrate. The element region is formed so as to partly or entirely cover the mounting terminals disposed on the support substrate.

According to the above manufacturing method, since the mounting terminals are formed on the support substrate and the element region is then formed on the mounting terminals, the element region can be etched in such a manner that the element region is connected to the mounting terminals. Thus, it is not necessary to form wiring lines to connect the element region to the mounting terminals after the etching. Not only these mounting terminals connected to the anodes disposed on an area of the element region, the area being close to the support substrate, are formed on the support substrate but also other mounting terminals connected to the cathodes disposed on an area of the element region, the area being opposite to the support substrate, may be formed on the support substrate. In this case, when the element region is formed over a face of the support substrate, the latter mounting terminals to be connected to the cathodes are covered with the element region. However, the element region covering these mounting terminals may be partly removed in a subsequent patterning step to allow the mounting terminals to be exposed, thereby connecting the mounting terminals to the cathodes.

In the method for manufacturing an organic EL device according to the present invention, the openings are preferably formed by an ion milling method in the step of patterning the element region.

According to the above manufacturing method, since the element region is patterned by an ion milling process, the emissive portions can be formed with extremely high accuracy. The ion milling process is a technique in which accelerated ions are caused to collide with a target to process the same. Therefore, the target, which is the element region on the support substrate in this case, can be processed according to the incident angle of ion beams. Thus, alternative openings having an end face perpendicular to the support substrate can be formed when the incident angle is, for example, 0°, that is, the ion beams are applied in parallel to the normal of the support substrate. In general, since argon ions are used in the ion milling process, components of the element region and the emissive portions are not damaged. Therefore, the malfunction of the emissive portions is not caused in the patterning step. Furthermore, in the ion milling process, when the element region is formed on a relatively large substrate and is then patterned, the entire substrate face having the element region can be uniformly irradiated with the ion beams. Thus, the ion milling process provides high productivity and is therefore industrially advantageous.

Alternatively, in the method for manufacturing an organic EL device according to the present invention, the openings may be formed by a laser ablation method in the step of patterning the element region.

In the above manufacturing method, the laser ablation method used for patterning the element region is a microprocessing technique in which laser beams are applied onto a target to remove beam-applied regions by the evaporation. Thus, laser beams can be applied onto the element region according to a predetermined pattern to form the openings in a scanning mode or the element region can be irradiated with laser beams using an open mask to readily pattern the element region.

A display unit according to the present invention includes a lighting device having any one of the above organic EL devices, and a display device to perform reflection display using light rays emitted from the lighting device.

According to the above configuration, the display unit including the following lighting device can be provided: a lighting device that emits light rays to the display device with high intensity, allows light rays reflected by the display device to pass through itself with high efficiency, and provides a sharp image.

In the display unit according to the present invention, the display device may include a reflective liquid crystal display having regions with no openings, the organic EL device may have cathodes that are part of the lighting device, and the cathodes may be arranged so as to correspond to the non-opening regions.

According to the above configuration, even if the lighting device is placed at the front face of the liquid crystal display unit, the aperture ratio of the liquid crystal display unit is not decreased, thereby obtaining a bright and sharp image.

DETAILED DESCRIPTION OF PREFERRED EMBODIMENTS

Exemplary embodiments of the present invention are described below with reference to the accompanying drawings.

(Liquid Crystal Display Unit Including Organic EL Device)

In this exemplary embodiment, a liquid crystal display unit, which is an exemplary display unit according to the present invention, including an organic EL device disposed at the front area thereof, is described. The liquid crystal display unit of this exemplary embodiment includes the organic EL device of the present invention, and the organic EL device functions as a front light (lighting device). The liquid crystal display unit illustrated in this exemplary embodiment is a reflection type and includes an active matrix display having thin-film transistors (TFTs) functioning as switching elements.

Figure 1:
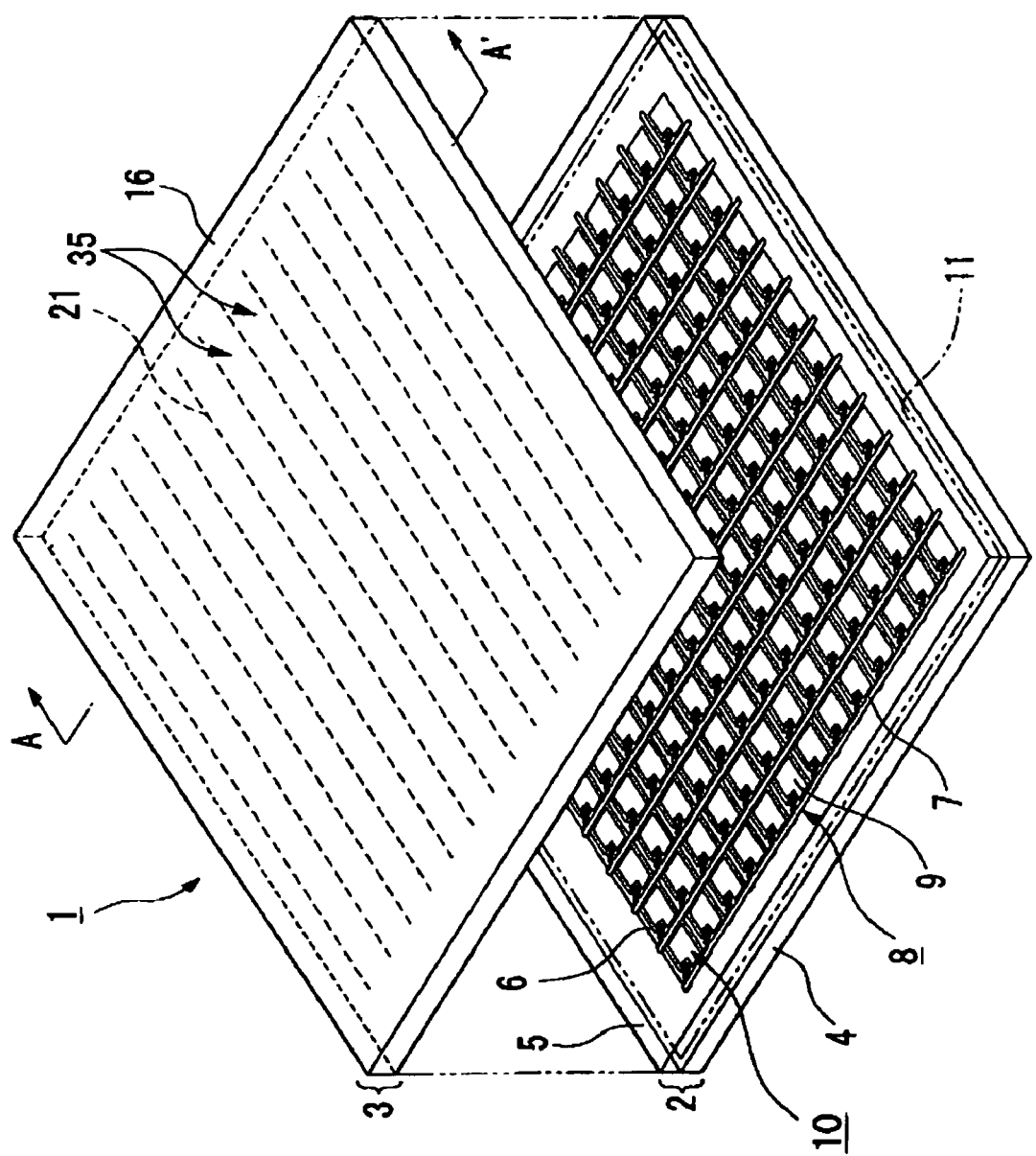
FIG. 1 is a perspective view showing a liquid crystal display unit according to an exemplary embodiment of the present invention.
Figure 2:
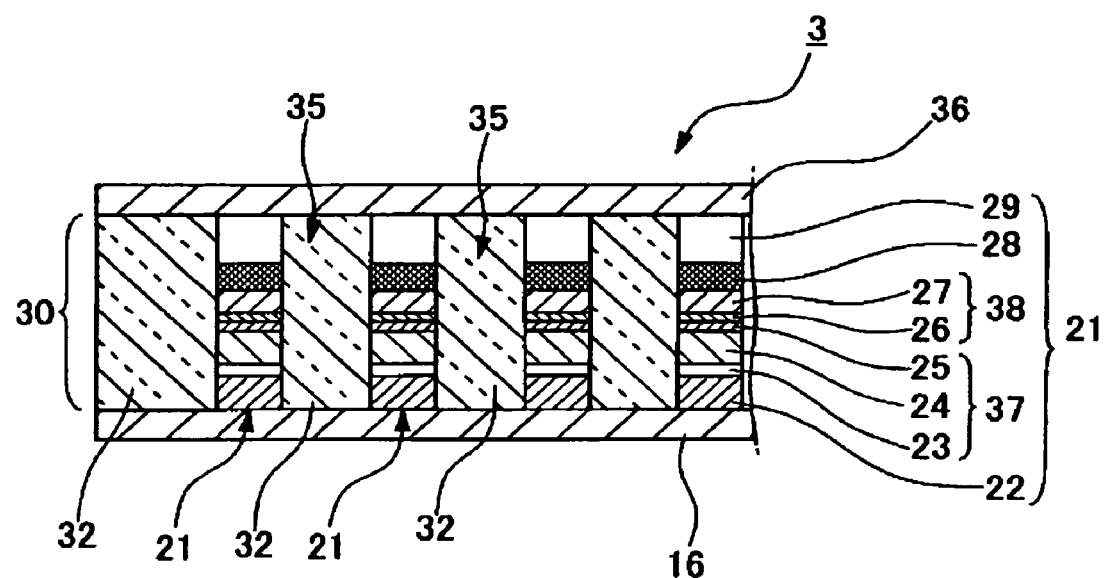
FIG. 2 is a fragmentary sectional view showing the front light shown in FIG. 1.

FIG. 1 is a perspective view showing a schematic configuration of the liquid crystal display unit of this embodiment. FIG. 2 is a fragmentary sectional view, taken along plane A–A' of FIG. 1, showing the front light. In all of the drawings referred to herein, in order to show layers and members on a recognizable scale, different scales are used depending on the size of the layers and the members. Thus, these drawings are not drawn to scale.

As shown in FIG. 1, the liquid crystal display unit 1 of this exemplary embodiment includes a liquid crystal cell (display device) 2 and a front light (lighting device) 3 disposed at the front area thereof.

The liquid crystal cell 2, which is an active matrix and reflection type, includes a counter substrate 5 and an element substrate 4 having TFTs 8. A liquid crystal layer (not shown) is disposed between the element substrate 4 and the counter substrate 5, which face each other. The element substrate 4 has a plurality of source lines 6 and gate lines 7 thereon. The source lines 6 and the gate lines 7 cross each other to form a grid pattern. Each TFT 8 is disposed near the intersection of each source line 6 and each gate line 7 and is connected to a corresponding pixel electrode 9. A plurality of pixels 10 are arranged in a matrix and each have the corresponding TFT 8 and pixel electrode 9. In the liquid crystal cell 2 according to this exemplary embodiment, the pixel electrodes 9 include a reflective metal material and function as reflective electrodes.

On the other hand, a single common electrode 11 is disposed under the lower surface of the counter substrate 5 and extends over the display region of the liquid crystal cell 2 having a plurality of the pixels 10 arranged in a matrix. In the liquid crystal cell 2, various wiring lines and alignment layers, which are not shown, are disposed between both substrates.

As shown in FIG. 1, the front light 3 includes a support substrate 16 including a transparent material, such as glass or a transparent resin, a plurality of emissive portions 21 arranged in a striped pattern when viewed from above, and a plurality of openings 35. Each opening 35 is disposed between the emissive portions 21. The emissive portions 21 and the openings 35 disposed on the support substrate 16 form an element region 30 included in the front light 3 according to this exemplary embodiment. As shown in FIG. 2, a protective substrate 36 including a transparent material, such as glass or a transparent resin, is disposed so as to face the support substrate 16. The element region 30 is placed between the protective substrate 36 and the support substrate 16. The openings 35 are filled with sealant 32.

As shown in FIG. 2, each emissive portion 21 includes an anode 22, a hole transport sub-layer 23, a emissive body sub-layer 24, a buffer sub-layer 25, an alkaline earth metal layer 26, a reflective layer 27, a light-shielding layer 28, and a resin layer 29 arranged on the support substrate 16, in that order. Each layer or sub-layer included in one of the emissive portions 21 has substantially the same thickness as that of a corresponding layer or sub-layer included in the other of the emissive portions 21. Among the layers and sub-layers of each emissive portions 21, the hole transport sub-layer 23, the emissive body sub-layer 24, and the buffer sub-layer 25 form an emissive layer 37 according to the present invention, and the alkaline earth metal layer 26 and the reflective layer 27 form a cathode 38 according to the present invention. That is, the emissive portions 21 includes the anode 22, the emissive layer 37, the cathode, the light-shielding layer 28, and the resin layer 29, which are disposed in that order.

A pair of mounting electrodes, which are not shown, is disposed under the support substrate 16. The connecting electrodes, including metal, are separately connected to the anode 22 and the cathode 38 directly or with a conductive member such as Ag paste or a wiring member. The element region 30 is connected to a peripheral circuit, such as a driving circuit, disposed outside or on the periphery of the front light 3 with mounting terminals of the connecting electrodes.

The layers and sub-layers included in each emissive portion 21 are described below in detail.

The anode 22 of the emissive portion 21 includes a transparent conductive material, such as ITO (indium tin oxide) or IZO (indium zinc oxide), and is therefore transparent.

The hole transport sub-layer 23 of the emissive layer 37 has a function of transporting holes, supplied from the anode 22, to the emissive body sub-layer 24. The hole transport sub-layer 23 contains poly(ethylenedioxy thiophene), which is a conductive polymer, as a main component and has a thickness of about 0.05 to 0.2 µm.

The emissive body sub-layer 24 includes, for example, an electroluminescent material containing an EL (electroluminescence) polymer, which is an organic electroluminescent material, as a main component and has a thickness of about 0.05 to 0.2 µm. In the emissive body sub-layer 24 including such an EL polymer, light can be emitted with a small voltage and high luminance can be achieved. The El polymer includes derivatives of fluorene polymers, polyparaphenylene vinylene derivatives, polyphenylene derivatives, polyfluorene derivatives, polyvinyl carbazole derivatives, and polythiophene derivatives.

The buffer sub-layer 25 functions as a buffer to promote the supply of electrons from the cathode 38 to the emissive body sub-layer 24. The buffer sub-layer 25 includes a material containing, for example, LiF as a main component and has a thickness of 0.5 to 5 nm.

The alkaline earth metal layer 26 of the cathode 38 contains alkaline earth metal, such as Ca or Mg, as a main component. The reflective layer 27 disposed on the alkaline earth metal layer 26 includes Al, Ag, or the alloy thereof and reflects light emitted from the emissive layer 37 to increase the quantity of light transmitted to the protective substrate 36 having the liquid crystal cell 2 functioning as an irradiated body. The cathode 38 has a thickness of about 0.1 to 0.5 µm.

The light-shielding layer 28 is disposed on the cathode 38 so as to intercept light reflected by the reflective layer 27 toward users. In the front light 3 of this exemplary embodiment, the light-shielding layer 28 preferably includes a conductive material, such as resin black or low-reflection chromium.

The resin layer 29 disposed on the light-shielding layer 28 is not essential for an organic EL device according to the present invention, and instead is included in the front light 3 according to the present invention when the front light 3 is manufactured by a below-mentioned method for manufacturing organic EL device of the present invention. The light-shielding layer 28 can be omitted when the resin layer 29 includes a resin material, such as a black resist containing dispersed carbon particles, having conductivity and light-shielding properties. Thus, the front light 3 of the present invention may include at least one of the light-shielding layer 28 and the resin layer 29.

The sealant 32 is disposed in the openings 35 surrounded by the emissive portions 21, the support substrate 16, and the protective substrate 36 and may include a transparent resin material. The sealant 32 preferably includes a material having a transmittance factor as high as possible. In particular, such a material includes, for example, a thermosetting epoxy resin.

The sealant 32 joins the protective substrate 36, the element region 30, and the support substrate 16 to each other, and protects the emissive portions 21 from oxygen and moisture in the atmosphere. In particular, the deterioration of the alkaline earth metal layer 26 in the cathode 38 is readily caused by oxygen and moisture in the atmosphere, because the alkaline earth metal layer 26 has high chemical activity. Such deterioration can be prevented or reduced with the sealant 32 being placed in the openings 35, thereby increasing the life of the front light 3. Furthermore, the sealant 32 prevents the support substrate 16 and the protective substrate 36 from reflecting light or reduces such reflected light at each surface thereof. Since the openings 35 contains air when the sealant 32 is not placed in the openings 35, reflection is caused due to a large difference in refractive index between the support substrate 16 and air and due to a large difference in refractive index between the protective substrate 36 and air. However, when the openings 35 are filled with the sealant 32, reflection can be prevented or reduced due to a small difference in refractive index between the support substrate 16 and the sealant 32 and due to a small difference in refractive index between the protective substrate 36 and the sealant 32. Thereby, in the liquid crystal display unit 1, the deterioration of the visibility caused by such reflection can be prevented or reduced.

In this exemplary embodiment, the liquid crystal display unit 1 having the above configuration is provided such that the openings 35 extend through the element region 30 of the front light 3. In the liquid crystal display unit 1 of this exemplary embodiment, light rays emitted from the emissive portions 21 of the front light 3 are applied onto the liquid crystal cell 2, the applied rays are reflected by the pixel electrodes 9 of the liquid crystal cell 2, and the reflected rays reach the lower surface of the front light 3 to pass through the openings 35 to form an image. Since the openings 35 extend through the element region 30, the front light 3 has a higher transmittance factor as compared with related art front lights for organic EL devices. Therefore, the reflected rays, transmitted from the liquid crystal cell 2, to display an image are hardly attenuated while the reflected rays pass through the front light 3, thereby increasing the quantity of light for display. Thus, the liquid crystal display unit 1 can display a bright image.

When the front light 3 is not turned on and reflection display is performed using external light, external light pass through the openings 35 to reach the liquid crystal cell 2 and is then reflected by the liquid crystal cell 2 to pass through the openings 35 again. Thereby, an image is displayed. Thus, the openings 35 having a large transmittance factor provide great advantages when the front light 3 is not turned on.

In the front light 3 of this exemplary embodiment, the openings 35 preferably have an area that is 80% or more of that of a display region in the front light 3, when viewed from above. As shown in FIG. 1, the display region of the front light 3 is defined herein as the upper face of the front light 3 disposed above the display area (the area in which the pixel electrodes 9 are arranged) of the liquid crystal cell 2 and corresponds to the display region of the liquid crystal display unit 1. When the openings 35 have an area that is 80% or more of that of the display region of the front light 3, rays reflected by the liquid crystal cell 2 is effectively passed through the openings 35, thereby obtaining a large luminance and a bright image. Furthermore, the emissive portions 21 are hardly recognized by users.

In order to make the emissive portions 21 more unrecognizable, the emissive portions 21 must have a width of 50 μm or less, in the case that the emissive portions 21 arranged in a striped pattern when viewed from above. When the width exceeds 50 μm, there is a risk that the emissive portions 21 are recognized depending on the environment of use. However, when the width is 50 μm or less, the emissive portions 21 are hardly recognized in any assumed situation. Furthermore, in addition to the above technique in which the width is reduced, in order to make the emissive portions 21 unrecognizable, the emissive portions 21 may be arranged at a non-display region of the liquid crystal cell 2. That is, the emissive portions 21 are arranged along the source lines 6 and/or the gate lines 7, which are placed on the liquid crystal cell 2 so as to form a grid pattern, so as to form a striped or grid pattern, thereby eliminating the emissive portions 21 from the space between users and the pixel electrodes 9 reflecting light, in the liquid crystal cell 2. According to this technique, light is effectively applied to the liquid crystal cell 2 without decreasing the aperture ratio of the liquid crystal display unit 1, thereby obtaining a bright image. Furthermore, in the liquid crystal cell 2, when the emissive portions 21 are arranged in such a pattern, a black matrix is formed above the source lines 6 and the gate lines 7. The framework of the black matrix disposed above the emissive portions 21, thereby making the emissive portions 21 less unrecognizable.

(Method for Manufacturing Organic EL Device)

A method for manufacturing an organic EL device is described below with reference to the drawings. In this exemplary embodiment, the front light 3 shown in FIGS. 1 and 2 is used.

FIGS. 3A to 5B show the steps of manufacturing the front light 3 of this exemplary embodiment. FIGS. 3A to 3C, 4A to 4C, 5A, and 5B illustrate the successive manufacturing steps in serial order. In these figures, unless otherwise specified, each plan view showing a corresponding manufacturing step is placed at the left area of each figure and a sectional view corresponding to the above plan view is placed at the right area of each figure. For example, in FIG. 3A, a plan view showing a manufacturing step is placed at the left area of this figure and a sectional view taken along the line B—B of this plan view is placed at the right area of this figure.

Figure 3:
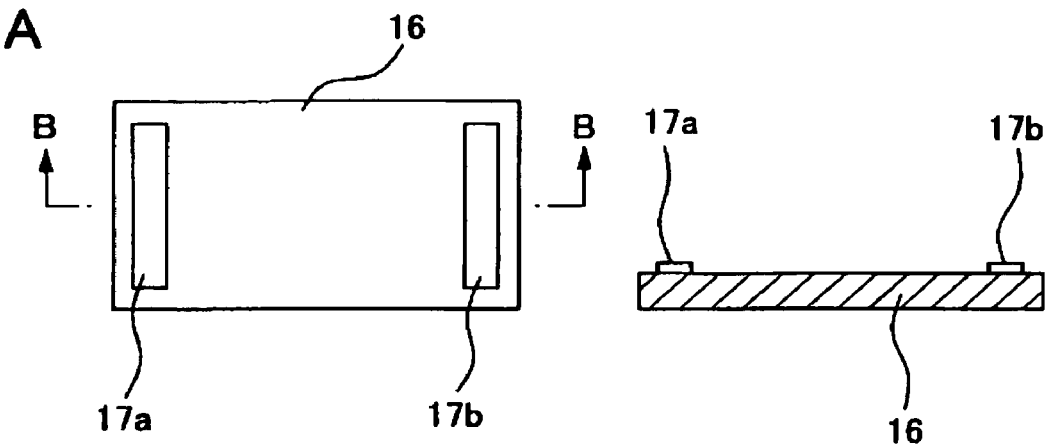
FIGS. 3A to 3C are schematics showing the steps of manufacturing a liquid crystal display unit according to an exemplary embodiment of the present invention.
Figure 3:
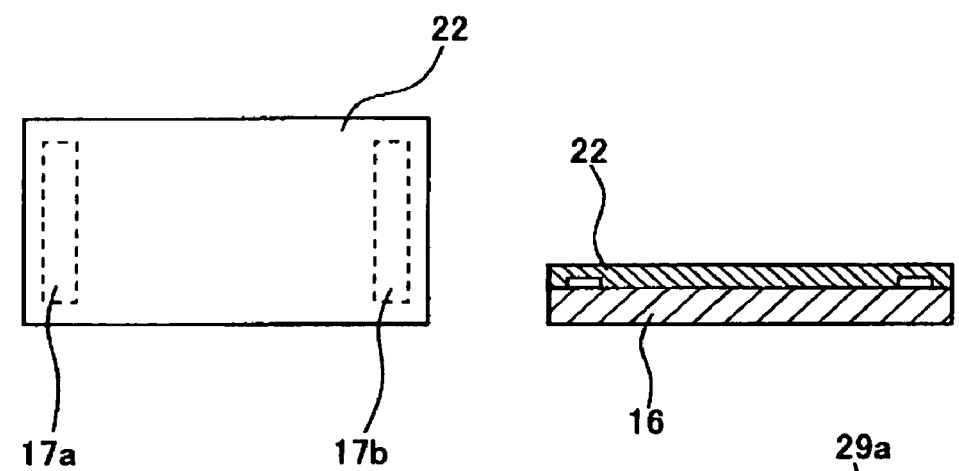
Figure 3:
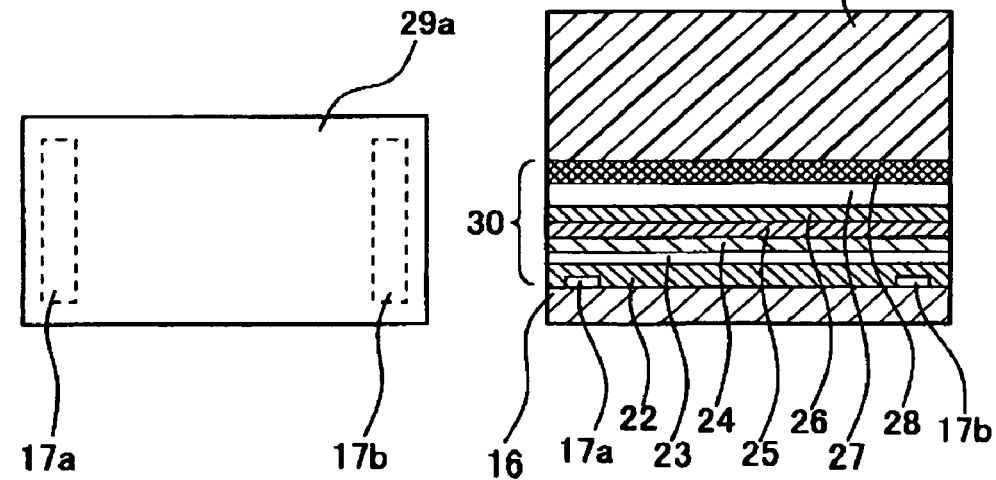
Figure 4:
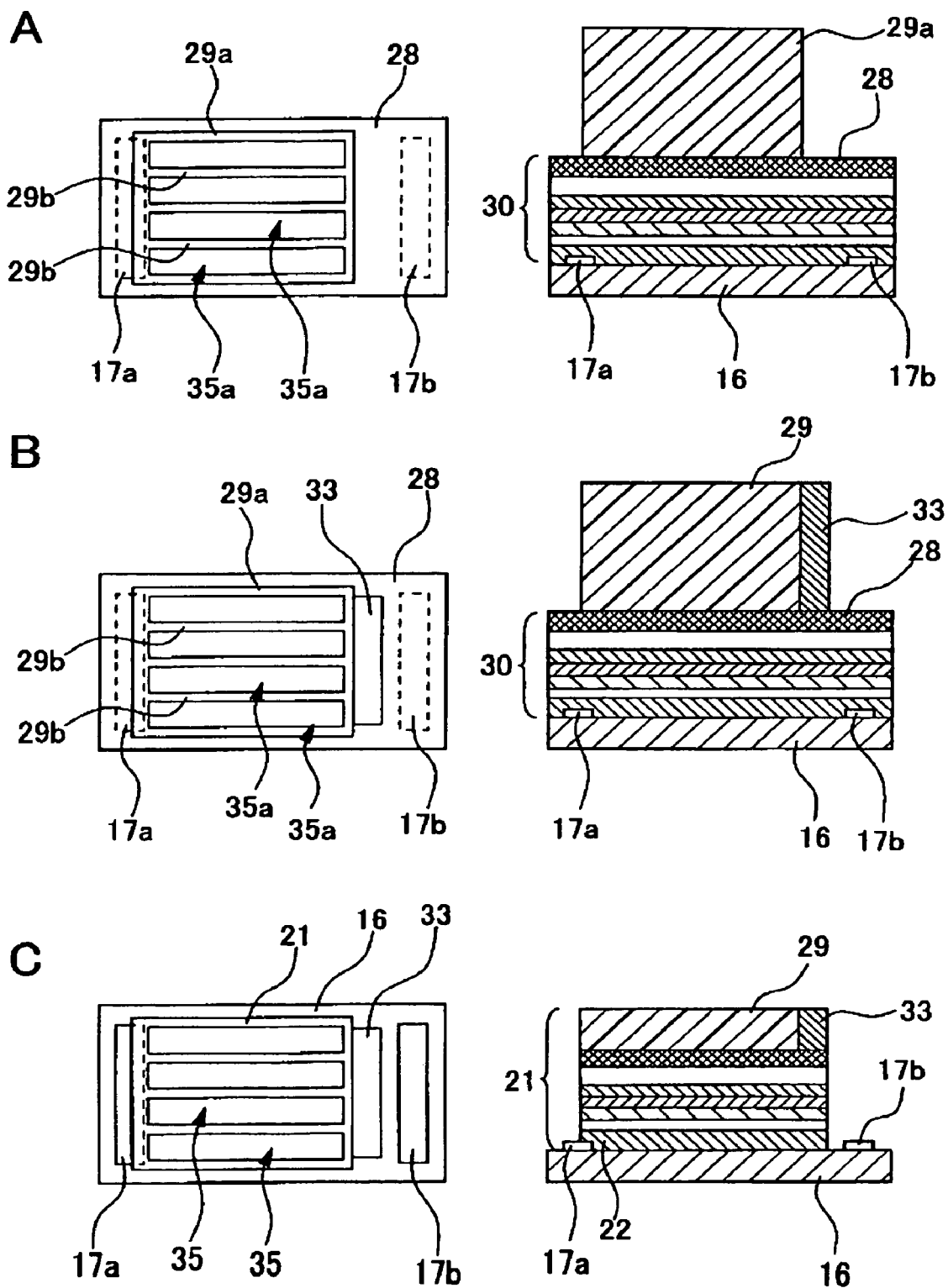
FIGS. 4A to 4C are schematics showing the steps of manufacturing the liquid crystal display unit according to an exemplary embodiment of the present invention.
Figure 5:
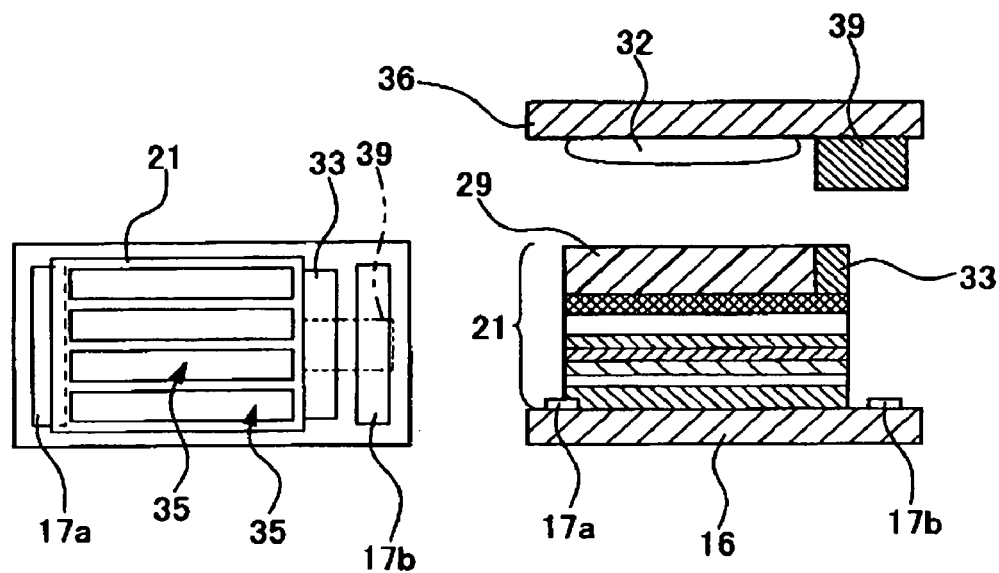
FIGS. 5A and 5B are schematics showing the steps of manufacturing the liquid crystal display unit according to an exemplary embodiment of the present invention.
Figure 5:
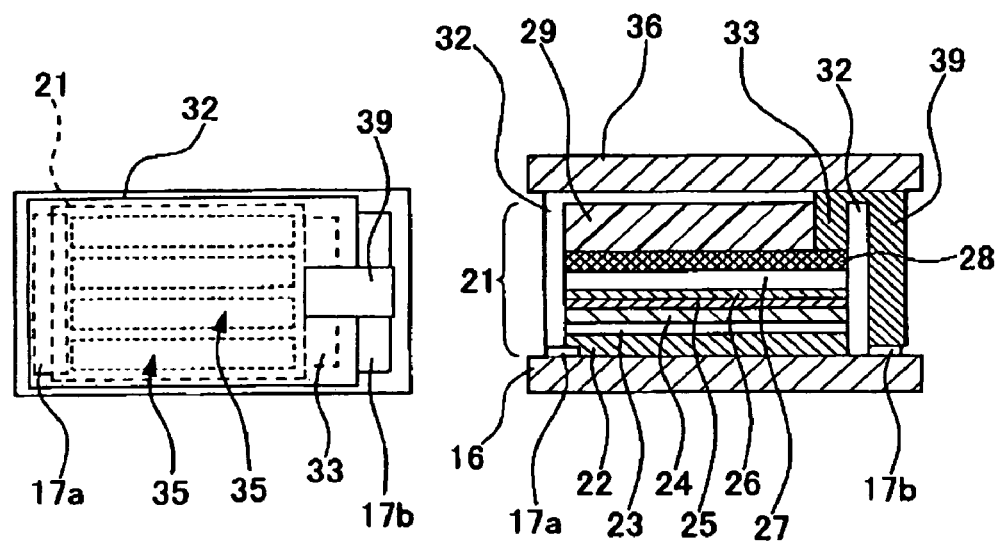

When the front light 3 shown in FIG. 2 is manufactured, a transparent support substrate 16, shown in FIG. 3, including glass, a transparent resin, or the like is prepared. First and second mounting terminals 17a and 17b, respectively, comprising Al, Au, or the like are then formed on the support substrate 16. As shown in FIG. 3A, the first and second mounting terminals 17a and 17b have a rectangular shape and are each placed along corresponding sides of the support substrate 16, the sides facing each other.

Subsequently, as shown in FIG. 3B, an anode 22 including a transparent material is formed over the support substrate 16 having the first and second mounting terminals 17a and 17b. As shown in FIG. 3C, a hole transport sub-layer 23, an emissive body sub-layer 24, a buffer sub-layer 25, an alkaline earth metal layer 26, a reflective layer 27, and a light-shielding layer 28 are formed over the anode 22 in that order to form an element region 30. A photoresist is applied to the light-shielding layer 28 to form a mask layer 29a. The layers included in the element region 30 include the same materials as those of the corresponding layers included in each emissive portion 21 shown in FIG. 2.

Subsequently, the mask layer 29a is patterned by a photolithographic process to form a pattern shown in FIG. 4A. The patterned mask layer 29a has a striped pattern and a rectangular shape when viewed from above and includes a plurality of pattern portions 29b and opening portions 35a having a rectangular shape when viewed from above. As shown in FIG. 4A, the light-shielding layer 28 is partly exposed at the upper surface of the element region 30 except for an area where the mask layer 29a is disposed.

As shown in FIG. 4B, a first connecting electrode 33 including Au, Ag, or paste containing Au, Ag, or the like is formed along the right side of the mask layer 29a. The first connecting electrode 33 is in contact with the light-shielding layer 28. That is, the light-shielding layer 28 having conductivity is electrically connected to the first connecting electrode 33, so that the first connecting electrode 33 is electrically connected to the cathode 38 having the alkaline earth metal layer 26 and the reflective layer 27 with the conductive light-shielding layer 28.

Argon ion beams are applied toward the support substrate 16 having the element portion 30 thereon to etch the mask layer 29a and the element region 30, thereby providing a predetermined pattern to the element region 30. As shown in FIG. 4C, in this etching step, part of the element region 30 that is covered with the mask layer 29a and the first connecting electrode 33 remains thereunder and other parts not covered with the mask layer 29a and the first connecting electrode 33 are removed, thereby forming the each emissive portion 21. As a result, each opening 35 is formed between the emissive portions 21, and the second mounting terminal 17b and part of the first mounting terminal 17a are exposed at the periphery of each emissive portion 21. As shown in FIG. 4C, the first mounting terminal 17a is partly exposed and the remainder is covered with each emissive portion 21. Thereby, the first mounting terminal 17a is electrically connected to the anode 22 of the emissive portions 21. In contrast, the second mounting terminal 17b is not electrically connected to the anode 22 because the second mounting terminal 17b is electrically connected to the first connecting electrode 33 in a below-mentioned step. Part of the mask layer 29a remains on the light-shielding layer 28 to function as a resin layer 29. The resin layer 29 and other layers of the element region 30 form each emissive portion 21. Since the resin layer 29 hardly has adverse effects on the transmittance factor and the visibility of the front light 3, it is not necessary to remove the resin layer 29. Since complicated processes are required in order to remove the resin layer 29, it is advantageous to allow the resin layer 29 to remain. When the resin layer 29 has an excessively large thickness, the front light 3 also has a large thickness, which is disadvantageous. Thus, the resin layer 29 preferably has a thickness of about 0.1 to 0.5 μm. Therefore, the mask layer 29a must be formed so as to have a desired thickness in the step shown in FIG. 3C.

When the element region 30 is etched by the above ion milling method, the argon ion beams are uniformly applied toward the support substrate 16 to the mask layer 29a and the element region 30 to etch the mask layer 29a and the element region 30 in one step. Thereby, the emissive portions 21 and the openings 35 are formed and the first and second mounting terminals 17a and 17b are exposed. Thus, the etching process is terminated at the point of time the first and second mounting terminals 17a and 17b are exposed. When the mask layer 29a is entirely removed before the first and second mounting terminals 17a and 17b are exposed, there is a risk that the light-shielding layer 28 and the reflective layer 27 disposed thereunder are etched, thereby causing the malfunction of the emissive portions 21. Therefore, in the step shown in FIG. 3C, the mask layer 29a is formed so as to have such a thickness that the mask layer 29a remains at the point of time the first and second mounting terminals 17a and 17b are exposed.

As shown in the sectional view placed in the right area of FIG. 5A, a protective substrate 36 is prepared. The protective substrate 36 is placed on the emissive portions 21 and joined thereto such that the protective substrate 36 is disposed at a position opposite to the support substrate 16, in a below step. A second connecting electrode 39 and sealant 32 are provided on a surface of the protective substrate 36, the surface facing the emissive portions 21. Alternatively, in order to prevent bubbles from remaining or reduce such bubbles, the sealant 32 may be provided on both the protective substrate 36 and the emissive portions 21. The second connecting electrode 39 and the sealant 32 are not shown in the plan view placed in the left area of FIG. 5A.

The second connecting electrode 39 includes a liquid conductive material, such as Ag paste, that can be solidified. As shown in the plan view placed in the left area of FIG. 5A, the second connecting electrode 39 joined to the protective substrate 36 is disposed above the first connecting electrode 33 disposed above the support substrate 16 and the second mounting terminal 17b. The sealant 32 includes the same material as that of the sealant 32 shown in FIG. 2, and preferably includes an insulating thermosetting or photocuring resin. The sealant 32 joins the protective substrate 36 to the emissive portions 21 on the support substrate 16. Since the sealant 32 is disposed in the openings 35, the sealant 32 protects the emissive portions 21 in addition to the joining function. That is, the sealant 32 covers the side face of each emissive portion 21 to shielding the emissive portion 21 from the atmosphere, thereby preventing the layers in the emissive portion 21 from being deteriorated due to oxygen and moisture in the atmosphere or reducing such deterioration. The sealant 32 preferably includes such a stable material that has high hermeticity and repels water.

As shown in the sectional view placed in the right area of FIG. 5B, the protective substrate 36 is placed on the emissive portions 21 and joined thereto. In this joining step, the second connecting electrode 39 of the protective substrate 36 is placed on the center of the upper surface of the first connecting electrode 33 disposed above the support substrate 16. Thereby, the sealant 32 is distorted such that the sealant 32 surrounds the emissive portions 21 and each opening 35 between the emissive portions 21 is filled with the sealant 32. The second connecting electrode 39 is joined to the second mounting terminal 17b in such a state that the second connecting electrode 39 extends along the surface of the sealant 32 surrounding each emissive portion 21. In the plan view placed in the left area of FIG. 5B, the protective substrate 36 is not shown.

As described above, the support substrate 16, the emissive portions 21, and the protective substrate 36 are joined to each other with the sealant 32 to form one piece, thereby obtaining the front light 3 according to the present invention. In the front light 3 shown in FIG. 5B, the first mounting terminal 17a is in contact with, and electrically connected to, the anode 22 of each emissive portion 21. The second mounting terminal 17b is electrically connected to the light-shielding layer 28 of the emissive portion 21 with the first and second connecting electrodes 33 and 39. The second mounting terminal 17b is further electrically connected to the alkaline earth metal layer 26 and the reflective layer 27, which form the cathode of the emissive portion 21.

The front light 3 manufactured according to the above steps includes the emissive portions 21 arranged in a predetermined pattern and the openings 35, filled with the sealant 32, extending from the protective substrate 36 to the support substrate 16. The emissive portions 21 arranged in the predetermined pattern emit light rays to an irradiated body, the emitted rays are reflected by the irradiated body, and the reflected rays pass through the openings 35 to form an image. Since the openings 35 are filled with the sealant 32, the openings 35 have extremely high transmittance factor, thereby obtaining a bright and sharp image.

In this exemplary embodiment, the first and second mounting terminals 17a and 17b are each disposed along corresponding two sides of the support substrate 16. The two sides face each other. However, the positions of the first and second mounting terminals 17a and 17b are not limited to such a configuration shown in FIGS. 3A to 5B and may be changed depending on the design of the front light 3. For example, when the first and second mounting terminals 17a and 17b are formed on the support substrate 16, the first and second mounting terminals 17a and 17b may be each arranged along corresponding two sides of the support substrate 16, such that the two sides are adjacent to each other. That is, the first and second mounting terminals 17a and 17b form substantially a L-shape when viewed from above. Alternatively, the first mounting terminal 17a connected to the anode 22 may be formed on the support substrate 16 and the second mounting terminal 17b connected to the cathode 38 (light-shielding layer 28) may be formed on a surface of the protective substrate 36, the surface facing the protective substrate 36. Furthermore, the first and second mounting terminals 17a and 17b may be formed on a surface of the protective substrate 36, the surface facing the protective substrate 36, and then connected to the anode 22 and the cathode 38, respectively.

The resin layer 29 (mask layer 29a) disposed at the top of the emissive portions 21 may include a photoresist having conductivity. In this case, the first connecting electrode 33 can be electrically connected to the cathode 38 including the reflective layer 27 and the alkaline earth metal layer 26 if the conductive light-shielding layer 28 is not formed. Thereby, the manufacturing steps can be reduced and therefore the manufacturing cost can be decreased.

In this exemplary embodiment, the element region 30 is etched by an ion milling method. However, the element region 30 may be etched by another method as long as all layers included in the element region 30 can be processed in one step. For example, the element region 30 may be etched by a laser ablation method. In this case, the mask layer 29a shown in FIGS. 3A–4C is not necessary. An optimum method to etch the element region 30 may be selected from the ion milling method and or the laser ablation method depending on a pattern to be formed. In particular, since the ion milling method is excellent in processing accuracy, the ion milling method is preferably employed when an extremely fine pattern is formed.

[Advantages]

As described above, an organic EL device according to the present invention includes a support substrate and an element region, disposed on the support substrate, including emissive portions and openings. The emissive portions each include an anode, an emissive layer containing an organic electroluminescent material, and a cathode that are arranged in that order and emit light rays to an irradiated body, and the openings extend through the element region. The emitted rays are reflected by the irradiated body to pass through the openings to form an image. In such a configuration, the openings have high transmittance factor. Thus, when this organic EL device is placed at the front area of a display unit so as to function as a lighting device, light rays for display are not attenuated by the organic EL device, thereby obtaining a bright and sharp image.

A method for manufacturing an organic EL device according to the present invention includes: forming an element region on a support substrate, and patterning the element region to form openings that extend through the element region and have a predetermined shape. Therefore, only one etchant is used in the patterning step, man-hours can be saved, and the manufacturing process can be simplified, thereby increasing the productivity and the yield.

What is claimed is:

1. An organic electroluminescent device, comprising:
   a first substrate; and
   a plurality of emitting layers that are horizontally disposed above the first substrate when viewed in a cross-sectional view, each of the plurality of emitting layers being disposed between a first electrode and a second electrode, and each of the plurality of emitting layers, the first electrode, the second electrode, and the first substrate being stacked along a first direction,
   a sealant provided between two adjacent emitting layers of the plurality of emitting layers,
   a light, emitted from at least one of the plurality of emitting layers,
   traveling through the sealant to exit the organic electroluminescent device, and
   the sealant contacting the first substrate without any intervening elements.

2. The organic electroluminescent device according to claim 1, the plurality of emitting layers being arranged in substantially a striped pattern when viewed from the first direction.

3. The organic electroluminescent device according to claim 1, the first substrate having a first mounting terminal connected to the first electrode and a second mounting terminal connected to the second electrode.

4. The organic electroluminescent device according to claim 3, the emitting layer having a light-shielding layer disposed on the second electrode, and having conductivity, and the second electrode being connected to the first mounting terminal of the first substrate or the second substrate with the light-shielding layer.

5. The organic electroluminescent device according to claim 1, further comprising a second substrate,
   the emitting layer, the first electrode and the second electrode disposed between the first substrate and the second substrate, the first substrate having a first mounting terminal on a surface facing the second substrate, the second substrate having a second mounting terminal on a surface facing the first substrate, the first mounting terminal of the first substrate being connected to the first electrode, and the second mounting terminal of the second substrate being connected to the second electrode.

6. The organic electroluminescent device according to claim 1, further comprising a second substrate,
   the emitting layer, the first electrode and the second electrode disposed between the first substrate and the second substrate, the first substrate having a pair of mounting terminals on a surface facing the second substrate, one of the mounting terminals being connected to the second electrode, and the other of the mounting terminals being connected to the second mounting terminal of the second substrate being connected to the first electrode with a connecting electrode extending along a side of the emitting layer.

7. The organic electroluminescent device according to claim 1, the member having a transparent resin material therein.

8. An organic electroluminescent device, comprising:
   a first substrate;
   a plurality of first electrodes that are disposed above the first substrate;
   a plurality of second electrodes that are disposed above the first substrate;
   a plurality of sealants that are disposed above the first substrate, each of the plurality of sealants being disposed in one opening of a plurality of openings; and
   a plurality of emitting layers that are disposed between one of the plurality of the first electrodes and one of the plurality of second electrodes,
   the plurality of emitting layers being horizontally disposed above the first substrate when viewed in a cross-sectional view, each of the plurality of emitting layers, the plurality of first electrodes, the plurality of second electrodes, and the first substrate being stacked along a first direction, and
   a sealant provided between two adjacent emitting layers of the plurality of emitting layers abutting,
   lights, emitted from the plurality of emitting layers,
   traveling through the sealant to exit the organic electroluminescent device, and
   the plurality of sealants contacting the first substrate without any intervening elements.

9. The organic electroluminescent device according to claim 8, a plurality of openings occupying an area that is 80% or more of an area occupied by a display region.

10. The organic electroluminescent device according to claim 9, the emitting layer being arranged in substantially a grid pattern when viewed from the first direction.

* * * * *